United States Patent
Park et al.

(10) Patent No.: US 7,755,279 B2
(45) Date of Patent: Jul. 13, 2010

(54) ORGANIC ELECTROLUMINESCENT DEVICE AND FABRICATING METHOD THEREOF

(75) Inventors: Jae-Yong Park, Gyeonggi-do (KR); Nam-Yang Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 54 days.

(21) Appl. No.: 10/331,320

(22) Filed: Dec. 31, 2002

(65) Prior Publication Data

US 2003/0160564 A1   Aug. 28, 2003

(30) Foreign Application Priority Data

Feb. 22, 2002   (KR)   .................. 10-2002-0009646

(51) Int. Cl.
*H05B 33/00* (2006.01)
*H01J 1/62* (2006.01)

(52) U.S. Cl. .................. 313/506; 313/504; 313/501; 428/690; 428/917; 257/79

(58) Field of Classification Search .............. 313/504, 313/506, 511, 512, 553; 315/169.3; 427/66; 445/24, 25

See application file for complete search history.

(56) References Cited

U.S. PATENT DOCUMENTS

| | | | | |
|---|---|---|---|---|
| 5,756,147 A | * | 5/1998 | Wu et al. ................ | 427/66 |
| 5,837,391 A | * | 11/1998 | Utsugi .................... | 428/690 |
| 6,046,547 A | * | 4/2000 | Nishio et al. ............ | 315/169.3 |
| 6,075,316 A | * | 6/2000 | Shi et al. ................ | 313/504 |
| 6,081,071 A | * | 6/2000 | Rogers .................... | 313/512 |
| 6,091,194 A | | 7/2000 | Swirbel et al. | |
| 6,175,345 B1 | | 1/2001 | Kuribayashi et al. | |
| 6,424,094 B1 | * | 7/2002 | Feldman ................. | 315/169.3 |
| 6,538,390 B2 | * | 3/2003 | Fujita et al. ............ | 315/169.3 |
| 6,548,961 B2 | * | 4/2003 | Barth et al. ............. | 315/169.3 |
| 6,605,826 B2 | * | 8/2003 | Yamazaki et al. ....... | 257/72 |
| 6,608,449 B2 | * | 8/2003 | Fukunaga ............... | 315/169.3 |
| 6,737,176 B1 | * | 5/2004 | Otsuki et al. ........... | 428/690 |
| 6,768,257 B1 | * | 7/2004 | Yamada et al. ......... | 313/504 |
| 6,781,746 B2 | * | 8/2004 | Yamazaki et al. ....... | 359/321 |
| 6,844,673 B1 | * | 1/2005 | Bernkopf ............... | 313/506 |
| 6,885,156 B2 | * | 4/2005 | Tajima et al. .......... | 315/169.3 |

(Continued)

FOREIGN PATENT DOCUMENTS

EP   0 883 191   9/1998

(Continued)

OTHER PUBLICATIONS

Machine English translation of JP 2001-282123 to Nakajima et al.*

*Primary Examiner*—Sikha Roy
(74) *Attorney, Agent, or Firm*—Morgan Lewis & Bockius LLP

(57) ABSTRACT

An organic electroluminescent device includes: a first substrate; a second substrate facing and spaced apart from the first substrate, the first and second substrates each having a pixel region; an array element on an inner surface of the first substrate, the array element including a plurality of thin film transistors within each pixel region; an organic electroluminescent diode on an inner surface of the second substrate; and a connection pattern electrically interconnecting the first and second substrates.

17 Claims, 6 Drawing Sheets

U.S. PATENT DOCUMENTS

| | | | |
|---|---|---|---|
| 7,176,620 B2 * | 2/2007 | Tsujimura et al. | 313/506 |
| 2001/0046611 A1 * | 11/2001 | Kido et al. | 428/690 |
| 2002/0011783 A1 * | 1/2002 | Hosokawa | 313/504 |
| 2002/0079494 A1 | 6/2002 | Kim et al. | |
| 2002/0158577 A1 | 10/2002 | Shimoda et al. | |
| 2003/0201712 A1 * | 10/2003 | Park et al. | 313/504 |

FOREIGN PATENT DOCUMENTS

| | | |
|---|---|---|
| EP | 1 085 576 | 9/2000 |
| EP | 1 371 101 | 3/2002 |
| JP | 10-333601 | 12/1998 |
| JP | 11-329743 | 11/1999 |
| JP | 2000-208252 | 7/2000 |
| JP | 2000-306664 | 12/2000 |
| JP | 2001-35663 | 2/2001 |
| JP | 2001-117509 | 4/2001 |
| JP | 2001-177509 | 4/2001 |
| JP | 2001-282123 | 10/2001 |
| JP | 2003-66859 | 3/2003 |
| KR | 2002-0047889 | 6/2002 |
| KR | 2004-0079476 | 9/2004 |
| WO | WO 99/03087 | 1/1999 |
| WO | WO 02/078101 | 10/2002 |
| WO | WO 02/078101 A1 * | 10/2002 |

* cited by examiner emission direction

ORGANIC ELECTROLUMINESCENT DEVICE AND FABRICATING METHOD THEREOF

The present invention claims the benefit of the Korean Patent Application No. P2002-9646 filed in Korea on Feb. 22, 2002, which is hereby incorporated by reference.

BACKGROUND OF THE INVENTION

1. Field of the Invention

The present invention relates to an organic electroluminescent device, and more particularly, to a top emission active matrix organic electroluminescent device and a fabricating method thereof.

2. Discussion of the Related Art

Liquid crystal display (LCD) devices are commonly used for flat panel displays (FPDs) because they are lightweight and consume relatively low amounts of power. However, LCD devices are not light-emitting displays. As such, LCDs have several disadvantages including dim displays, poor contrast ratios, narrow viewing angles and small display sizes. Accordingly, new FPDs, such as organic electroluminescent (EL) devices, have been developed to solve these problems. Organic EL devices are light-emitting displays that possess a wider viewing angle and a better contrast ratio than LCD devices. Furthermore, since no backlight is required for an organic EL device, organic EL devices generally are both lighter and thinner than LCD devices, and consume less power. Organic EL devices may be driven with a low direct current (DC) voltage that permits a faster response speed than LCD devices. Moreover, since organic EL devices are solid-phase devices, unlike LCD devices, they can better withstand external impacts and possess a greater operational temperature range. In addition, organic EL devices may be manufactured more cheaply than LCD devices or plasma display devices (PDPs) because organic EL devices require only deposition and encapsulation apparatus. Organic EL devices may be either top emission organic EL devices or bottom emission organic EL devices depending on the direction of the emitted light.

A passive matrix design that does not use thin film transistors (TFTs) may be used for organic EL devices. In passive matrix organic EL devices, scanning lines and signal lines perpendicularly cross each other in the form of a matrix. A scanning voltage is sequentially applied to the scanning lines to operate each pixel. The voltage applied to a pixel when its scan line is selected should be the voltage required to produce the desired average brightness for the pixel multiplied by the number of the scanning lines. Accordingly, as the number of scanning lines increases, the applied voltage and current demanded by the passive matrix organic EL device increase. Therefore, a passive matrix organic EL device is inadequate for a large high-resolution display because the device has high power consumption, which may cause the device to fail more rapidly.

Since passive matrix organic EL devices are disadvantaged in display resolution, power consumption and expected life span, active matrix organic EL devices have been developed as next-generation display devices that provide high resolution over a large display area. In active matrix organic EL devices, a TFT, disposed at each sub-pixel, is used as a switching element to turn the sub-pixel ON or OFF. Specifically, a first electrode, which is connected to the TFT, is turned ON or OFF by the sub-pixel, and a second electrode, which faces the first electrode, functions as a common electrode. The sub-pixel may retain a voltage applied to the sub-pixel by storing charge in a storage capacitor. The storage capacitor may drive the device until a new scan cycle occurs, and may allow the voltage applied to a sub-pixel to remain the same regardless of the number of scanning lines. Since an equivalent brightness is obtained with lower current demands, active matrix organic EL devices allow larger displays consuming less power and providing higher resolution to be made.

FIG. 1 is an equivalent circuit diagram showing a basic pixel structure of an active matrix organic electroluminescent device according to the related art. In FIG. 1, a scanning line 1 is arranged along a first direction, and a signal line 2 and a power line 3 spaced apart from each other are arranged along a second direction perpendicular to the first direction, thereby defining a pixel region P. A switching TFT $T_S$, which is an addressing element, is connected to the scanning line 1 and the signal line 2. A storage capacitor $C_{ST}$ is connected to the switching TFT $T_S$ and the power line 3. A driving TFT $T_D$, which is a current source element, is connected to the storage capacitor $C_{ST}$ and the power line 3. An organic EL diode $D_{EL}$ is connected to the driving TFT $T_D$. When a forward current is applied to the organic EL diode $D_{EL}$, an electron and a hole are recombined to generate an electron-hole pair through the P(positive)-N(negative) junction between the anode providing the hole and the cathode providing the electron. The electron-hole pair has a lower energy than the separated electron and hole. Thus, the recombination of the electron and the hole causes light to be emitted as a result of the energy difference. The switching TFT $T_S$ adjusts the forward current through the driving TFT $T_D$ and stores charges in the storage capacitor $C_{ST}$.

FIG. 2 is a cross-sectional view of a bottom emission organic electroluminescent device according to the related art. FIG. 2 shows one pixel region including red, green, and blue sub-pixel regions. In FIG. 2, a first substrate 10 faces and is separated from a second substrate 30. A peripheral portion of the first and second substrates 10 and 30 is sealed with a seal pattern 40. A TFT T is formed at each sub-pixel region $P_{sub}$ on an inner surface of the first substrate 10. A first electrode 12 is connected to the TFT T in each sub-pixel region. An organic electroluminescent layer 14 including luminescent materials that are red, green, or blue is formed on the TFT T and the first electrode 12. A second electrode 16 is formed on the organic electroluminescent layer 14. The first and second electrodes 12 and 16 apply an electric field to the organic electroluminescent layer 14. An adhesive (not shown) and a moisture absorbent material (not shown) are formed on an inner surface of the second substrate 30 to shield the device from external moisture. In a bottom emission organic electroluminescent device, a first electrode 12 functioning as an anode is made of a transparent conductive material, and a second electrode 16 functioning as a cathode includes a metallic material with a low work function. Here, the organic electroluminescent layer 14 is composed of a hole injection layer 14a, a hole transporting layer 14b, an emission layer 14c, and a electron transporting layer 14d which cover the first electrode 12. In the emission layer 14c, red, green, and blue emissive materials are alternately disposed at adjacent sub-pixel regions. For example, in FIG. 3, green emissive material is disposed at sub-pixel $P_{sub}$, while the adjacent sub-pixels have red emissive material and blue emissive material, respectively.

FIG. 3 is a cross-sectional view showing one sub-pixel region of a bottom emission organic electroluminescent device according to the related art. In FIG. 3, a TFT T having a semiconductor layer 62, a gate electrode 68, a source electrode 80 and a drain electrode 82 is formed on a substrate 10. The source electrode 80 of TFT T is connected to a storage capacitor $C_{ST}$. The drain electrode 82 of TFT T is connected to an organic electroluminescent (EL) diode $D_{EL}$. The storage capacitor $C_{ST}$ includes a power electrode 72 facing a capacitor electrode 64. An insulating layer is interposed between the power electrode 72 and the capacitor electrode 64. The capacitor electrode 64 includes the same material as the semiconductor layer 62. The TFT T and the storage capacitor $C_{ST}$ are referred to as an array element A. The organic EL diode $D_{EL}$ includes a first electrode 12 facing a second electrode 16, and an organic EL layer 14 interposed between the first electrode 12 and the second electrode 16. The source electrode 80 of the TFT T is connected to the power electrode 72 of the storage capacitor $C_{ST}$, and the drain electrode 82 of the TFT T is connected to the first electrode 12 of the organic EL diode $D_{EL}$. The array element A and the EL diode $D_{EL}$ are formed on the same substrate in the organic electroluminescent device according to the related art.

FIG. 4 is a flow chart showing a fabricating process of an organic electroluminescent device according to the related art. In a first step, array element is formed on a first substrate. The array element includes a scanning line, a signal line, a power line, a switching TFT, and a driving TFT. The signal line is spaced apart from the power line, and the signal line and the power line each cross the scanning line. The switching TFT is disposed at the crossing point of the scanning line and the signal line. The driving TFT is disposed at the crossing point of the scanning line and the power line.

In a second step, a first electrode of an organic EL diode is formed over the array element. The first electrode is connected to the driving TFT of its respective sub-pixel region.

In a third step, an emission layer of the organic EL diode is formed on the first electrode. If the first electrode is designed to function as an anode, the organic EL layer may be composed of a hole injection layer, a hole transporting layer, an emission layer, and an electron transporting layer.

In a fourth step, a second electrode of the EL diode is formed on the organic EL layer. The second electrode is formed over an entire surface of the first substrate to function as a common electrode.

In a last step, the first substrate is encapsulated with a second substrate. The second substrate protects the first substrate from external impacts and prevents damage of the organic EL layer caused by air. A moisture absorbent material may be included in an inner surface of the second substrate.

The organic EL device according to the related art is fabricated by encapsulating the first substrate including the array element and the organic EL diode with the second substrate. Since the production yield of the organic EL device is equal to the production yield of the array element multiplied by the production yield of the organic EL diode, the production yield for an organic EL device is limited by the process for the organic EL diode. Even if the array element is satisfactorily fabricated, the organic EL device may be faulty because the organic EL layer is defective. Accordingly, the expense of fabricating an array element properly and the associated material cost are lost and the production yield is reduced when organic EL diodes are improperly fabricated in an organic EL device according to the related art.

Bottom emission organic EL devices have the advantages of high encapsulation stability and high process flexibility. However, bottom emission organic EL devices are ineffective for high resolution devices because they have poor aperture ratios. In contrast, a top emission organic EL device has a higher expected life span since it is easy to fabricate and has a high aperture ratio. However, in a top emission organic EL device, the cathode is generally formed on the organic EL layer. As a result, the transmittance and optical efficiency of a top emission organic EL device are reduced because of a limited number of materials that may be selected. When a thin film protection layer is used to minimize the transmittance reduction, the top emission organic EL device is not sufficiently shielded from ambient air.

SUMMARY OF THE INVENTION

Accordingly, the present invention is directed to an organic electroluminescent device and a fabricating method thereof that substantially obviate one or more of the problems due to limitations and disadvantages of the related art.

An object of the present invention is to provide an organic electroluminescent device including a first substrate that array element is formed thereon, a second substrate that an organic electroluminescent diode is formed thereon and a connection pattern electrically connecting the first and second substrates.

An object of the present invention is to provide a top emission organic electroluminescent device that has a stable structure, and a fabricating method thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes: a first substrate; a second substrate facing and spaced apart from the first substrate, the first and second substrates each having a pixel region; an array element on an inner surface of the first substrate, the array element including a plurality of thin film transistors within each pixel region; an organic electroluminescent diode on an inner surface of the second substrate; and a connection pattern electrically interconnecting the first and second substrates.

In another aspect, a method of fabricating an organic electroluminescent device includes: forming an array element on a first substrate having a pixel region, the array element including a plurality of thin film transistors within each pixel region; forming an organic electroluminescent diode on a second substrate; forming a connection pattern to electrically interconnect the first substrate and the second substrate; and connecting the first substrate and the second substrate electrically with the connection pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
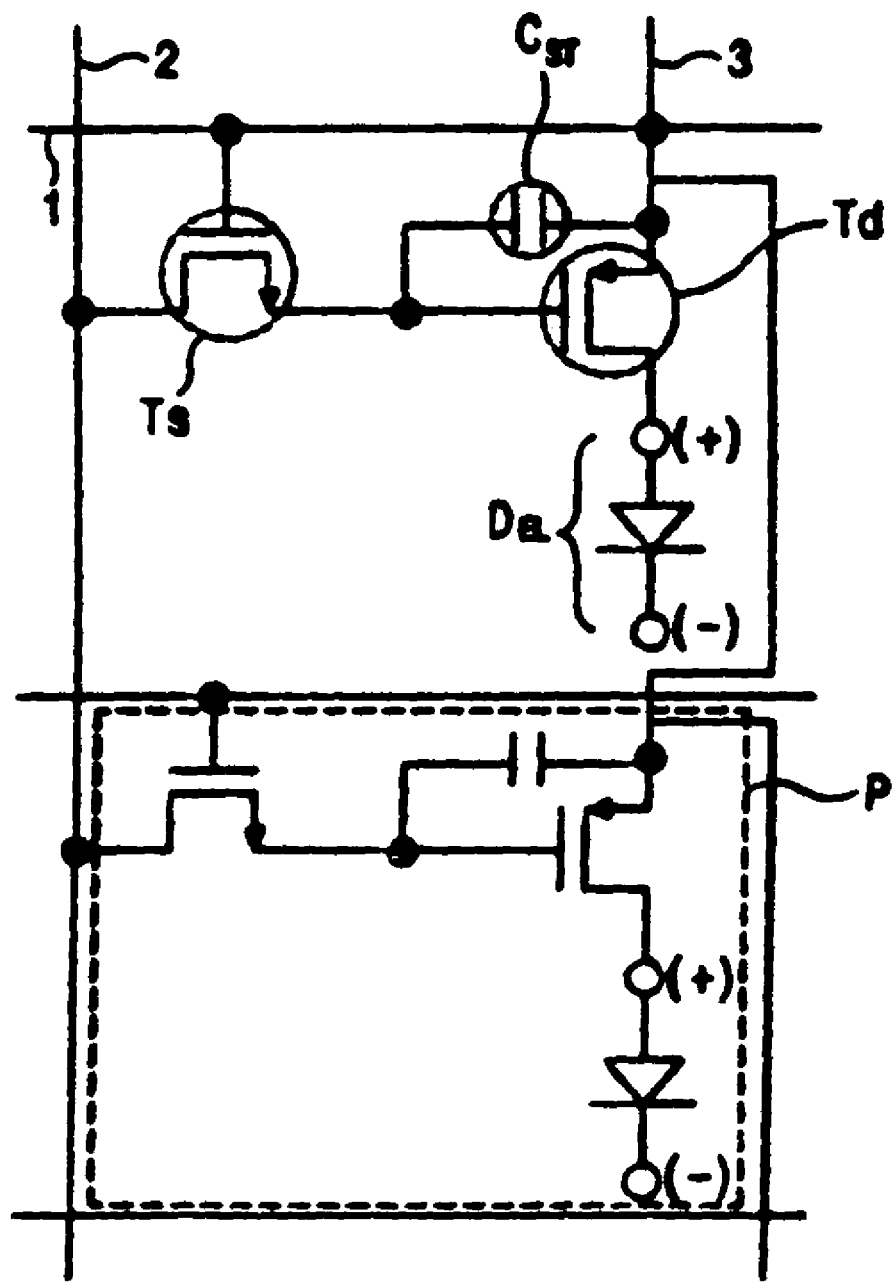
FIG. 1 is an equivalent circuit diagram showing a basic pixel structure of an active matrix organic electroluminescent device according to the related art.
Figure 2:
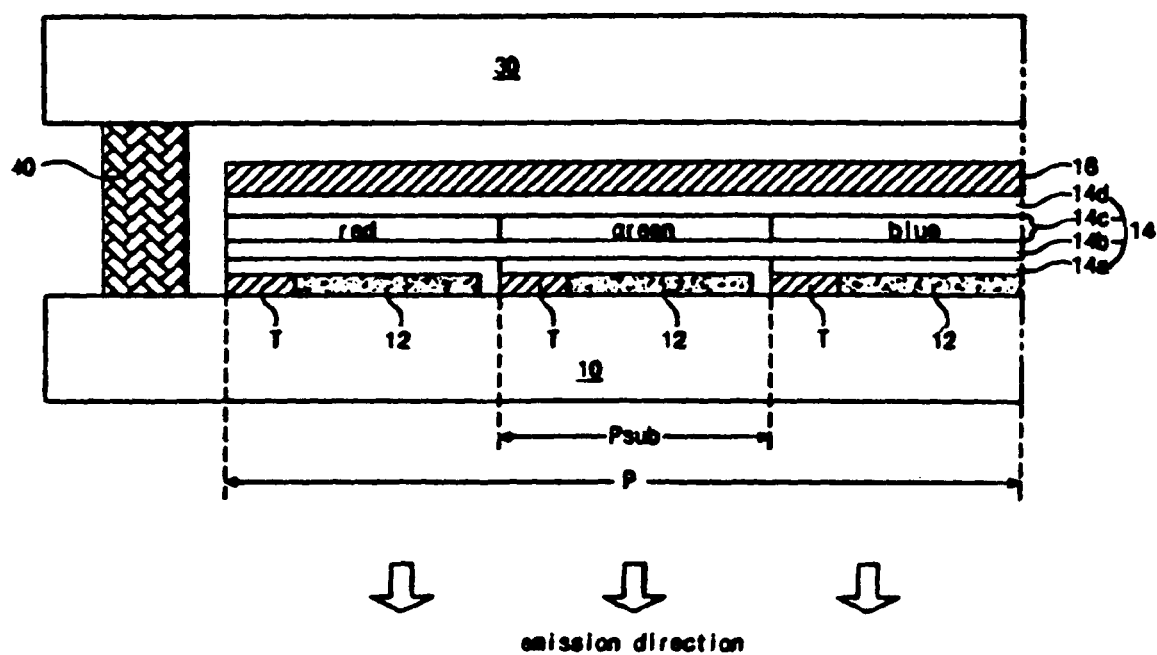
FIG. 2 is a cross-sectional view of a bottom emission organic electroluminescent device according to the related art.
Figure 3:
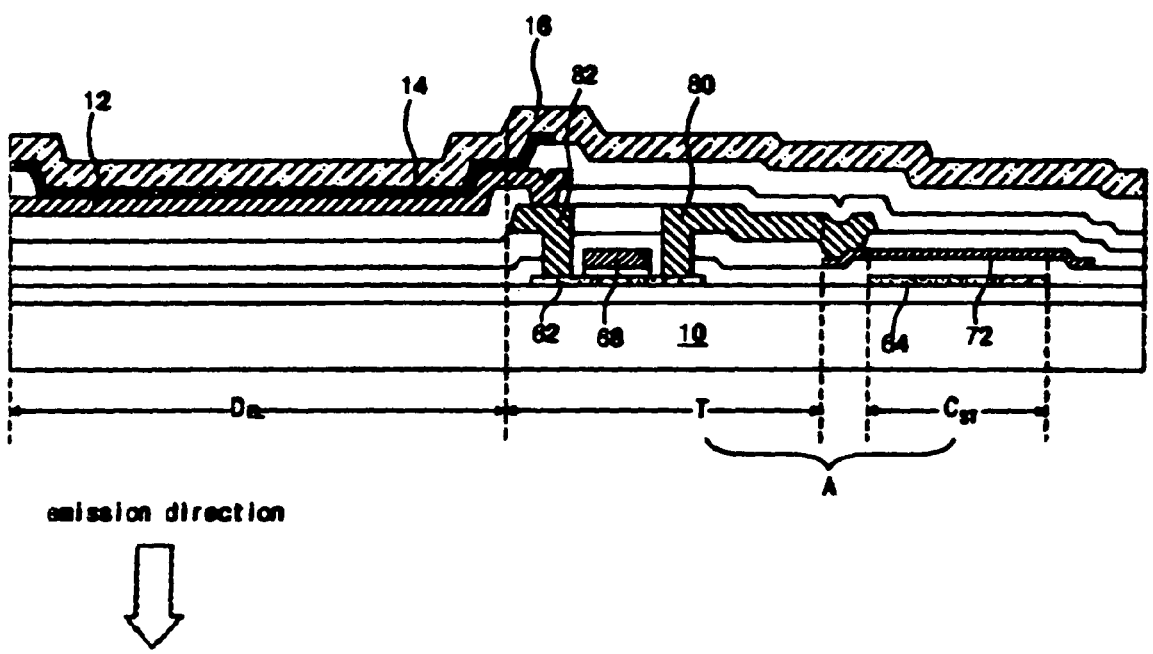
FIG. 3 is a cross-sectional view showing one sub-pixel region of a bottom emission organic electroluminescent device according to the related art.
Figure 4:
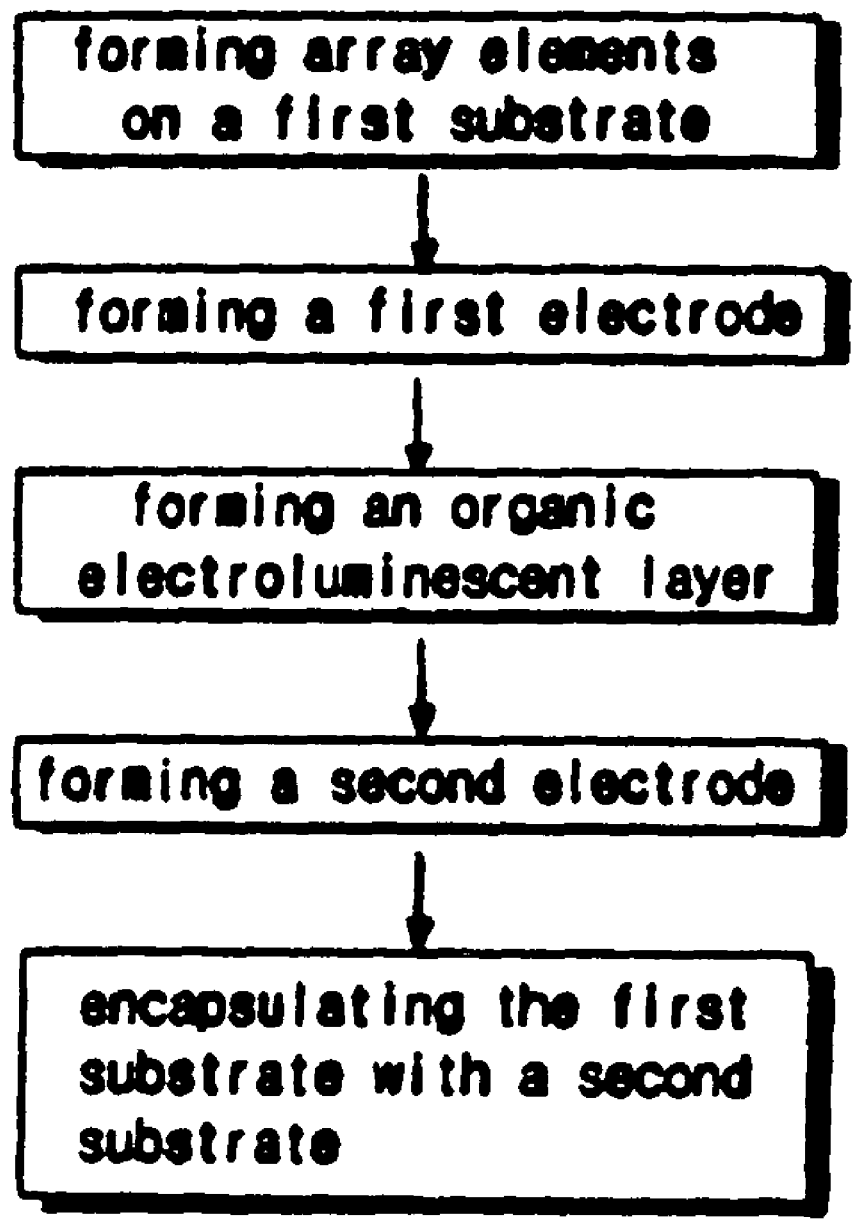
FIG. 4 is a flow chart showing a fabricating process of an organic electroluminescent device according to the related art.
Figure 5:
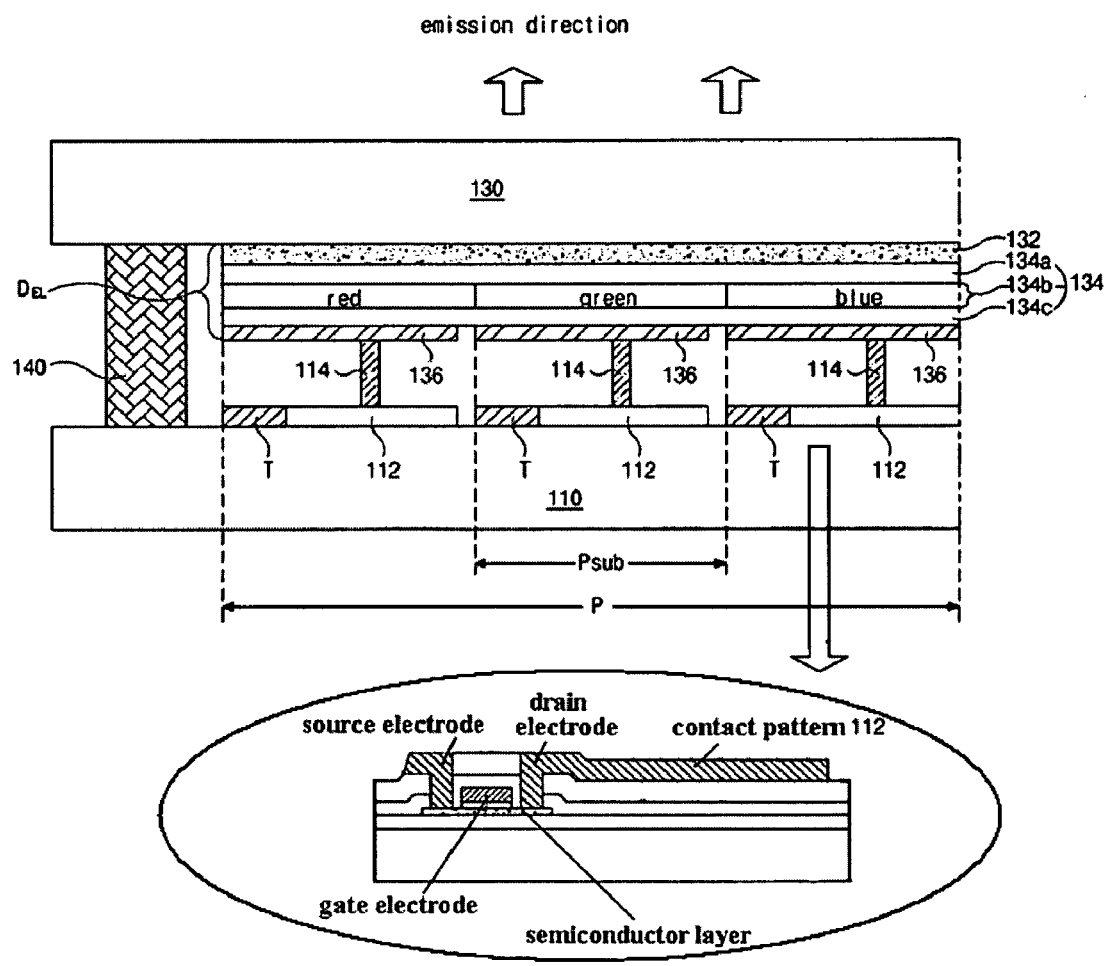
FIG. 5 is a cross-sectional view of one pixel of an exemplary organic electroluminescent device according to the present invention.

FIG. 5 is a cross-sectional view of one pixel of an exemplary organic electroluminescent device according to the present invention. In FIG. 5, a first substrate 110 may face and may be separated from a second substrate 130. A seal pattern 140 may be formed along a peripheral portion between the first substrate 110 and the second substrate 130. Array element 120 may be formed on an inner surface of the first substrate 110 and an organic electroluminescent (EL) diode $D_{EL}$ may be formed on an inner surface of the second substrate 130. The organic EL diode $D_{EL}$ may include a first electrode 132, an organic EL layer 134, and a second electrode 136. The first electrode may be formed on an inner surface of the second substrate 130 and may function as a common electrode. The organic EL layer 134 may be formed on the first electrode 132, and the second electrode 136 may be formed on the organic EL layer 134 at each sub-pixel region $P_{sub}$. The organic EL layer 134 may include a first organic material layer 134a, an emission layer 134b, and a second organic material layer 134c. The first organic material layer 134a may be formed on the first electrode 132 and the emission layer 134b may be formed on the first organic layer 134a. In the emission layer 134b, red, green, and blue emissive materials may be alternately disposed at adjacent sub-pixel regions. For example, in FIG. 5, green emissive material is disposed at sub-pixel region $P_{sub}$, while the adjacent sub-pixels have red emissive material and blue emissive material. The second organic material layer 134c may be formed on the emission layer 134b. The type of electroluminescent material to be used for the first and second organic material layers 134a and 134c may be determined according to the disposition of an anode and a cathode. When the first electrode 132 is a cathode, and the second electrode 136 is an anode, the first organic material layer 134a may include an electron injection layer and an electron transporting layer, and the second organic material layer 134c may include a hole injection layer and a hole transporting layer. When the first electrode 132 is an anode, and the second electrode 136 is a cathode, the first organic material layer 134a may include a hole injection layer and a hole transporting layer, and the second organic material layer 134c may include an electron injection layer and a electron transporting layer.

The array element 120 may include a thin film transistor (TFT) T and a contact pattern 112 connected to the TFT T. The contact pattern 112 may be formed by extending an electrode of the TFT T or by patterning an additional metal layer. The TFT T may be a driving TFT connected to the organic EL diode $D_{EL}$. Moreover, a connection pattern 114 may be formed between the second electrode 136 and the contact pattern 112 in each sub-pixel region $P_{sub}$. The connection pattern 114 may electrically connect the second electrode 136 and the TFT T. The connection pattern 114 may have a sufficient thickness and a sufficient area to contact the second electrode 136 and the contact pattern 112. For example, the connection pattern 114 may have a columnar structure. The connection pattern 114 may include a conductive material, which is preferably a flexible metallic material of low resistivity. The connection pattern 114 may be formed in conjunction with the formation of the array element 120 on the first substrate 110.

In FIG. 5, the top emission organic EL device may emit light through the second substrate 130. Accordingly, the first electrode 132 may include a transparent or semi-transparent conductive material. When the first electrode 132 is designed as a cathode, the first electrode 132 may include a metallic material with a lower work function than a material of the second electrode 136. Preferably, the metallic material included in the first electrode 132 may be thin enough to transmit light. The metallic material may include at least one of aluminum (Al), aluminum:magnesium (Al:Mg) alloy, aluminum:lithium (Al:Li) alloy, and aluminum:benzonate alloy. The second electrode 136 may include an opaque conductive material that prevents the reflection of light toward the first substrate 100. When the first and second electrodes 132 and 136 are designed as an anode and a cathode, respectively, the first electrode 132 may include one of indium-tin-oxide (ITO) and indium-zinc-oxide (IZO). Preferably, a space between the array element 120 and the second electrode 136 may be filled with nitrogen gas ($N_2$) for example.

Although not shown, the array element 120 may include a scanning line, a signal line, a power line, a switching TFT, and a storage capacitor. The signal line may be spaced apart from the power line, and the signal line and the power line may cross the scanning line. The switching TFT may be disposed where the signal line and the power line cross.

A first substrate having an array element and a second substrate having an organic EL diode are individually provided, and the first and second substrates are connected by a connection pattern. Accordingly, an organic electroluminescent device with high resolution, a high aperture ratio, and improved production yield has been described.

Figure 6:
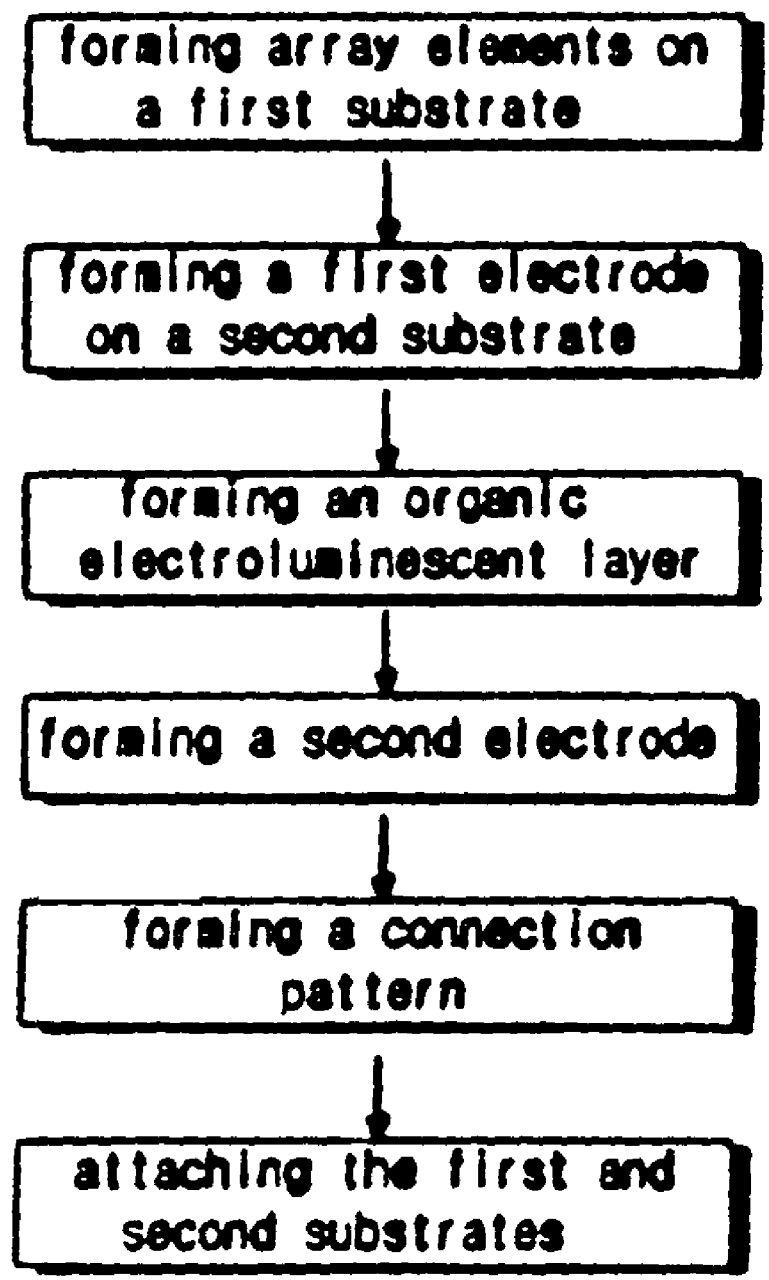
FIG. 6 is a flow chart of an exemplary fabricating process of an organic electroluminescent device according to the present invention.

FIG. 6 is a flow chart of an exemplary fabricating process of an organic electroluminescent device according to the present invention. In a first step, array elements, which may include a switching element in each sub-pixel region, may be formed on a first substrate. For example, a buffer layer may be formed on the first substrate, and a semiconductor layer and a capacitor electrode may be formed on the buffer layer. A gate electrode, a source electrode, and a drain electrode may be formed on the semiconductor layer. A power electrode connected to the source electrode may be formed over the capacitor electrode. A contact pattern contacting a connection pattern may be formed by extending the drain electrode or patterning an additional metal layer. The connection pattern may electrically connect the array element and a second electrode of an organic EL diode. If the connection pattern were formed on the organic electroluminescent diode over a second substrate, a photolithographic process may damage an organic EL layer of the organic EL diode. Therefore, it may be preferable to form the connection pattern on the array element in each sub-pixel region after forming the array element on the first substrate. The connection pattern may have a columnar structure.

In a second step, a first electrode of an organic EL diode may be formed on a second substrate. Since the first electrode is formed directly on the second substrate, a wider range of materials may be selected for the first electrode, and a fabricating process of the first electrode may be more easily performed. The first electrode may be made of a transparent conductive material. For example, the first electrode may function as an anode and may include one of indium-tin-oxide (ITO) and indium-zinc-oxide (IZO).

In a third step, an organic EL layer may be formed on the first electrode. The organic EL layer may include an emission layer, an injection layer, and a transporting layer. The emission layer may be made of red, green, and blue emissive materials where the red, green, and blue emission layers may be alternately disposed at adjacent sub-pixel regions. The injection layer may inject a hole or an electron, and the transporting layer may transport a hole or an electron. The injection layer and the transporting layer may include a polymer.

In a fourth step, a second electrode may be formed on the organic EL layer. For example, the second electrode may function as a cathode and may include an opaque metallic material.

In a fifth step, the first substrate may be electrically connected to the second substrate via the contact pattern and the connection pattern. Specifically, one end of the connection pattern may contact either the switching element of the array element or the contact pattern connected to the switching element, and the other end of the connection pattern may contact the second electrode. The connection pattern may connect the driving TFT of the first substrate and the organic EL diode of the second substrate.

In a sixth step, the first and second substrates may be attached using a seal pattern formed along a peripheral portion between the first and second substrates. The array elements of the first substrate may be spaced apart from the second electrode of the second substrate, and the space between the array elements and the second electrode may be filled with nitrogen gas ($N_2$) for example. A moisture absorbent material 150 (of FIG. 5) preventing moisture from contacting the organic EL layer may be formed on either the first substrate or the second substrate adjacent to the seal pattern. The moisture absorbent material 150 may have a columnar structure similar to the seal pattern for example.

In the organic EL device according to the present invention, the first substrate and the second substrate may be individually inspected after forming the array element and the organic EL diode, respectively, and then only first substrates and second substrates that pass inspection may be attached. Therefore, the production yield for an organic EL device is improved resulting in increased production efficiency and longer expected life spans for organic EL devices. Moreover, a top emission organic EL device with high resolution and a high aperture ratio results from the improved process. In addition, a larger range of materials may be selected for the electrode of the organic EL diode since it directly contacts with a substrate. Furthermore, since the organic electroluminescent layer of the organic EL diode is protected by a substrate, the device is more adequately protected from ambient air and moisture.

It will be apparent to those skilled in the art that various modifications and variations can be made in the organic electroluminescent device of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   a first substrate;
   a second substrate facing and spaced apart from the first substrate, the first and second substrates each having pixel regions, wherein the device is a top emission organic electroluminescent device that emits light through the second substrate;
   an array element on an inner surface of the first substrate, the array element including a plurality of thin film transistors and a plurality of contact patterns wherein the respective contact patterns is formed by extending a drain electrode of the respective thin film transistors;
   organic electroluminescent diodes on an inner surface of the second substrate, wherein each organic electroluminescent diode includes a first electrode, a second electrode, and a organic electroluminescent layer between the first and second electrodes;
   connection patterns electrically interconnecting the first and second substrates, wherein the connection patterns and the thin film transistors are alternately arranged and further wherein the respective connection patterns directly contacts with the respective contact patterns and the respective organic electroluminescent diodes; and
   a seal pattern at a peripheral portion bonding the first and second substrates to each other,
   wherein the connection patterns is formed on the array element of the first substrate and is connected with the organic electroluminescent diodes of the second substrate,
   wherein the pixel regions each includes a red sub-pixel region, a green sub-pixel region, and a blue sub-pixel region,
   wherein the organic electroluminescent layer includes an electron injection layer, an electron transport layer, red/green/blue emission layers, a hole transport layer, and a hole injection layer,
   wherein the first electrode is commonly formed in the sub-pixel regions while the second electrode is divided into the sub-pixel regions, and
   wherein the electron injection layer and the electron transport layer are commonly formed in the sub-pixel regions and the hole transport layer and the hole injection layer are commonly formed in the sub-pixel regions, while the red, green, and blue emission layers are formed in the red, green and blue sub-pixel regions respectively, wherein the electron injection layer, the electron transport layer, the hole transport layer and the hole injection layer are commonly formed in the red, green and blue sub-pixel regions without dividing the red, green and blue sub-pixel regions.

2. The device according to claim 1, wherein the connection pattern includes a flexible metallic material.

3. The device according to claim 1, wherein the connection pattern has a columnar shape.

4. The device according to claim 1, wherein the first electrode functions as a cathode and the second electrode functions as an anode.

5. The device according to claim 4, wherein the first electrode has a work function lower than a work function of the second electrode, wherein the first electrode includes at least one metallic material and is thin enough to transmit light.

6. The device according to claim 5, wherein the first electrode includes at least one of aluminum, aluminum:magnesium (Al:Mg) alloy, aluminum:lithium (Al:Li) alloy, and aluminum:benzonate alloy.

7. The device according to claim 6, wherein the second electrode includes an opaque conductive material.

8. The device according to claim 1, wherein the array element is spaced apart from the organic electroluminescent diode by a space substantially equal in height to a height of the connection pattern.

9. The device according to claim 8, wherein the space is filled with nitrogen gas ($N_2$).

10. The device according to claim 1, further comprising a moisture absorbent material on one of the first and second substrate adjacent to the seal pattern, wherein the moisture absorbent material has a columnar shape.

11. A method of fabricating an organic electroluminescent device, comprising steps of:
   forming an array element on a first substrate having pixel regions, the array element including a plurality of thin film transistors and a plurality of contact patterns wherein the respective contact patterns is formed by extending a drain electrode of the respective thin film transistors;
   forming organic electroluminescent diodes on a second substrate, wherein each organic electroluminescent diode includes a first electrode, a second electrode, and a organic electroluminescent layer between the first and second electrodes;
   forming connection patterns on the array element of the first substrate to electrically interconnect the first substrate and the second substrate;
   bonding the first and second substrate to each other using the seal pattern; and
   connecting the first substrate and the second substrate electrically with the connection patterns, wherein the connection patterns and the thin film transistors are alternately arranged and further wherein the respective connection patterns directly contacts the respective contact pattern and the respective organic electroluminescent diodes,
   wherein the pixel regions each includes a red sub-pixel region, a green sub-pixel region, and a blue sub-pixel region,
   wherein the organic electroluminescent layer includes an electron injection layer, an electron transport layer, red/green/blue emission layers, a hole transport layer, and a hole injection layer,
   wherein the first electrode is commonly formed in the sub-pixel regions while the second electrode is divided into the sub-pixel regions, and
   wherein the electron injection layer and the electron transport layer are commonly formed in the sub-pixel regions and the hole transport layer and the hole injection layer are commonly formed in the sub-pixel regions, while the red, green, and blue emission layers are formed in the red, green and blue sub-pixel regions respectively, wherein the electron injection layer, the electron transport layer, the hole transport layer and the hole injection layer are commonly formed in the red, green and blue sub-pixel regions without dividing the red, green and blue sub-pixel regions.

12. The method according to claim 11, further comprising a step of inspecting the first substrate and the second substrate before the step of connecting the first substrate and the second substrate electrically with the connection pattern.

13. The device according to claim 11, wherein the first electrode functions as an anode and the second electrode functions as a cathode.

14. The device according to claim 13, wherein the first electrode has a work function greater than a work function of the second electrode.

15. The device according to claim 14, wherein the first electrode includes one of indium-tin-oxide (ITO) and indium-zinc-oxide (IZO).

16. The device according to claim 15, wherein the second electrode includes an opaque conductive material.

17. The method according to claim 11, further comprising a moisture absorbent material on one of the first and second substrate adjacent to the seal pattern, wherein the moisture absorbent material has a columnar shape.

* * * * *